United States Patent
Zeidler

(10) Patent No.: US 7,274,409 B2
(45) Date of Patent: Sep. 25, 2007

(54) DYNAMICALLY CONTROLLED TUNER AGC ATTACK POINT

(75) Inventor: David E. Zeidler, Warrington, PA (US)

(73) Assignee: General Instrument Corporation, Horsham, PA (US)

( * ) Notice: Subject to any disclaimer, the term of this patent is extended or adjusted under 35 U.S.C. 154(b) by 509 days.

(21) Appl. No.: 10/909,504

(22) Filed: Aug. 2, 2004

(65) Prior Publication Data

US 2006/0023125 A1    Feb. 2, 2006

(51) Int. Cl.
*H04N 5/52* (2006.01)

(52) U.S. Cl. ...................................................... 348/678
(58) Field of Classification Search ........ 348/731–733, 348/725, 522; 455/234.1, 232.1, 266, 254
See application file for complete search history.

(56) References Cited

U.S. PATENT DOCUMENTS

| 5,339,454 | A | * | 8/1994 | Kuo et al. ................ 455/247.1 |
| 6,014,547 | A | * | 1/2000 | Caporizzo et al. .......... 725/151 |
| 6,148,189 | A | * | 11/2000 | Aschwanden ............ 455/234.1 |
| 2004/0021798 | A1 | * | 2/2004 | Lindstrom et al. .......... 348/731 |
| 2006/0187360 | A1 | * | 8/2006 | Hutchinson et al. ........ 348/733 |
| 2006/0205372 | A1 | * | 9/2006 | Bouillet et al. .......... 455/234.1 |

\* cited by examiner

*Primary Examiner*—Paulos M. Natnael
(74) *Attorney, Agent, or Firm*—Benjamin D Driscoll

(57) ABSTRACT

A tuner is controlled to manage noise and distortion levels in a video signal. The tuner recovers an RF modulated video signal. A video demodulator provides a baseband video signal from the recovered RF modulated video signal. At least one of signal-to-noise ratio (SNR) and intermodulation distortion (IMD) is determined for the baseband video signal. An AGC attack point of the tuner is dynamically controlled in response to the SNR and/or IMD in order to improve the video quality.

22 Claims, 5 Drawing Sheets

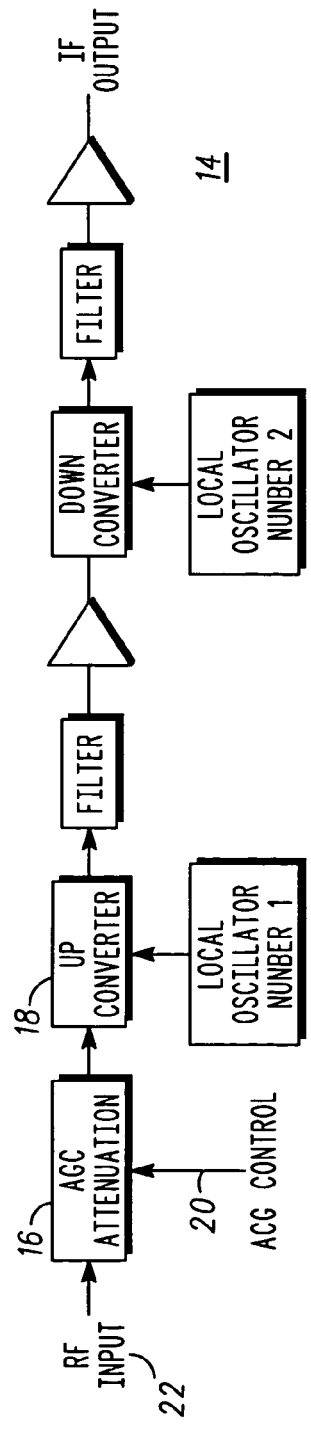
*FIG. 2* —PRIOR ART—
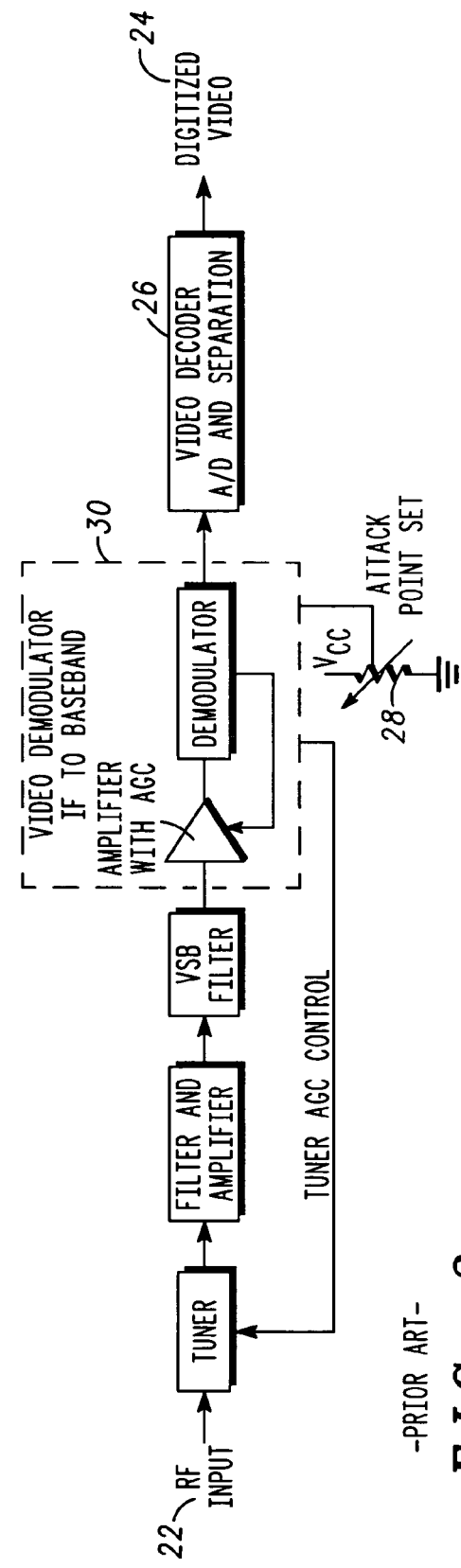
*FIG. 3* —PRIOR ART—

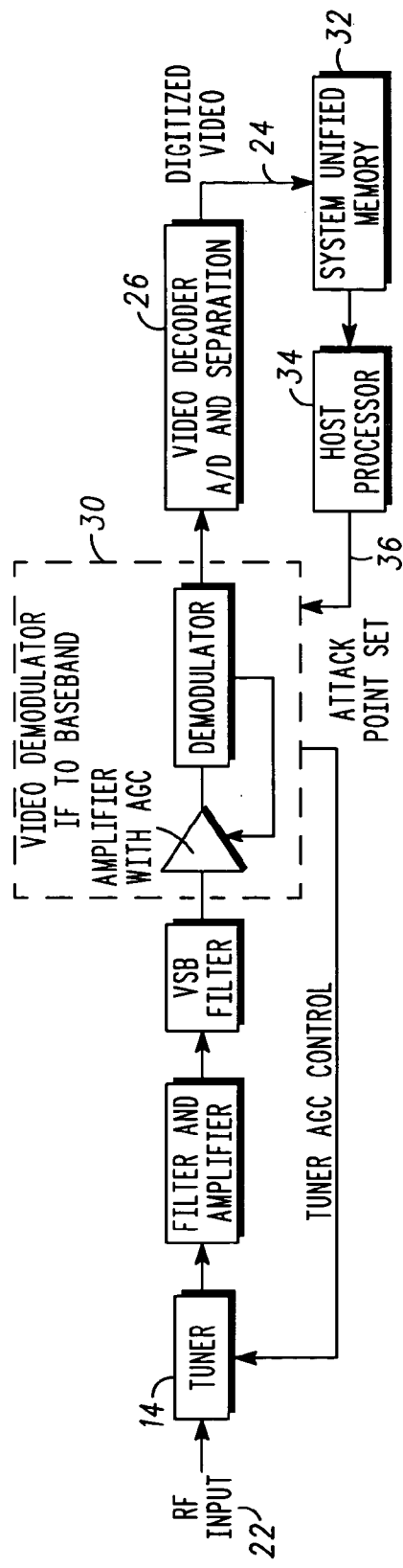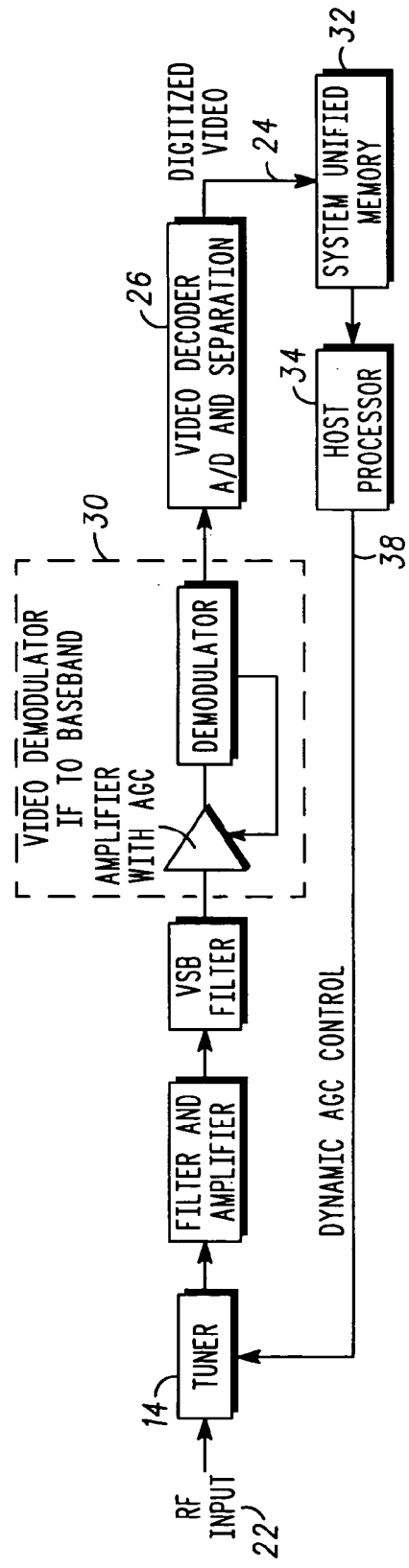

DYNAMICALLY CONTROLLED TUNER AGC ATTACK POINT

BACKGROUND OF THE INVENTION

The present invention relates to video communications, and more particularly to methods, apparatus, and systems for adjusting an automatic gain control (AGC) for a tuner to reduce intermodulation distortion (IMD) and noise in a television picture or the like.

In a "settop box" for cable television reception, or any other device that demodulates RF modulated video to baseband video, the tuner is generally considered to be the most critical section in terms of noise and intermodulation distortion (IMD). Noise causes random fluctuations in the picture, often referred to as "snow." For purposes of simplicity, IMD can be described as causing diagonal lines in the picture. The visual effects of IMD are actually much more involved than this simple characterization, and have been the subject of much research.

To minimize noise, and thus maximize signal-to-noise ratio (SNR), the input level to the tuner should be maximized. To minimize IMD, the input level to the tuner, post AGC, should be minimized because IMD occurs in the tuner front end active components, and is proportional to the total input power (i.e., the input power of all the channels combined). Therefore a balance is set for acceptable noise and IMD. In this terminology, the "input level to the tuner" actually refers to the tuner level at the first active device thereof, typically the up-converter.

FIG. 1 shows the resulting noise and IMD with increasing input channel power, with the tuner set at full gain (no tuner AGC attenuation). As can be seen from this figure, a balance is needed between SNR and IMD. In practice, this balance is controlled by an automatic gain control in the tuner front end.

FIG. 2 is a simplified block diagram of a typical prior art television tuner 14. The power level to be optimized is at the input to the up-converter 18, and is controlled by the AGC attenuation function 16. An AGC control line 20 provides a voltage level that controls the amount of attenuation applied between the RF input 22 and the up-converter 18. For low level input power conditions, the tuner is set to full gain, i.e. no AGC attenuation. For high level input power conditions, AGC attenuation is applied in an amount proportional to the power level.

The RF input power point at which AGC attenuation is first applied is termed the "Attack Point." For input levels above the attack point, the up-converter will see a fixed power level equal to the attack point. For input levels below the attack point, the up-converter will see the RF input level, since the AGC attenuation is set to no attenuation.

FIG. 3 shows the full video processing path from RF input 22 to demodulated digitized video 24. Digitized and separated video 24 (e.g., in CCIR656 Y/Cr/Cb format) is provided by the video decoder 26, which contains an analog to digital converter (A/D) and separation blocks.

The attack point setting 28 at the video demodulator 30 establishes a level limit in the demodulator, thereby limiting the signal level into the tuner's up-converter at the desired attack point of the tuner. The attack point is a fixed value that is set for each unit when manufactured, to compensate for the overall tuner gain (post AGC attenuation), IF amplifier gain, and demodulator unit to unit variations.

There are various drawbacks to the fixed AGC control practiced in the prior art as described above. Although the fixed AGC attack point control has worked for many years in analog and digital settop boxes, it is not optimal in providing the best quality picture. With the advent of affordable large screen TVs, the best possible picture quality is essential. Among the drawbacks to prior art AGC implementations are the following:

1. The attack point is set for one RF channel. Since the overall tuner gain varies with respect to channel frequency, the actual attack point changes versus frequency. Therefore the desired balance between noise and IMD is not maintained. The actual attack point will be too high for low tuner gain channels, and too low for high tuner gain channels.
2. The actual attack point moves versus temperature, due to the tuner gain and IF path gain changing with respect to temperature.
3. If the particular tuned channel has a low RF level compared to the rest of the cable television channels, the tuner up-converter will see too much power (due to the high power levels of the non-tuned channels) and IMD will be too high.
4. If the particular tuned channel has a high RF level compared to the rest of the cable channels, the tuner up-converter power level will not be as high as it could be for best video SNR.
5. If a particular tuner has a very good noise figure overall, or a good noise figure on certain channels, lowering the attack point would yield better IMD performance while still providing good video SNR. Conversely, a tuner with worse noise figure characteristics would need a higher attack point to maintain good video SNR.
6. The attack point is chosen for the worst case cable plant loading, i.e., all analog channels. With digital channels now occupying much of the channel space, the attack point could be raised, since the digital channels are at a lower power level and distortion effects are not as visible. However the attack point is only set once, at factory build time, where the end user's cable loading characteristics is unknown and dynamic.

Accordingly, it would be advantageous to provide a dynamically controlled AGC attack point for television tuners and the like. The present invention provides methods and apparatus for implementing such a dynamic control, thereby improving both SNR and IMD in a television picture or other video display derived from an RF input signal.

SUMMARY OF THE INVENTION

In accordance with the present invention, a method is provided for controlling a tuner for radio frequency (RF) modulated video signals. An RF modulated video signal is recovered in the tuner. The recovered signal is demodulated to obtain a baseband video signal. At least one of signal-to-noise ratio (SNR) and intermodulation distortion (IMD) is determined for the baseband video signal. An AGC attack point of the tuner is controlled in response to at least one of SNR and IMD.

The AGC attack point can be controlled dynamically based on at least one of the SNR and IMD of the baseband video signal. In an illustrated embodiment, the baseband video signal comprises digitized video, and at least one of SNR and IMD is determined from the digitized video.

As an example, a quiet video line of the digital video can be captured, and the video SNR can be determined during the quiet line. In such an implementation, the quiet video line can be captured during a vertical blanking interval of the baseband video signal. The quiet video line can also be analyzed to determine IMD. This analysis can comprise, e.g., using a Fast Fourier Transform (FFT) to determine IMD.

Alternatively, or in conjunction with the above-described techniques, line-to-line averaging over multiple video fields can be used for at least one of the SNR and IMD determinations. In a preferred embodiment, the AGC attack point is controlled based on at least one of SNR and IMD of the baseband video signal, substantially exclusive of noise and IMD present in the input signal to the tuner. In addition, limits can be set on high and low extremes of attack point adjustments made during the controlling step.

The attack point can be controlled, for example, via an attack point setting during the demodulating step. Alternatively, an AGC setting provided during the recovering step can be used to control the attack point. A video decoder used for the video decoding can provide IMD levels for controlling the AGC attack point.

Corresponding apparatus is also provided in accordance with the invention.

BRIEF DESCRIPTION OF THE DRAWINGS

Referring now to the figures, wherein like elements are numbered alike:

FIG. 2 is a block diagram of an RF tuner as known in the prior art.

FIG. 3 is a block diagram of a video demodulator having an AGC control, as known in the prior art.

FIG. 4 is a block diagram of a first embodiment of apparatus for dynamically controlling an AGC attack point of a tuner in accordance with the present invention.

FIG. 5 is a block diagram of a second embodiment of apparatus for dynamically controlling an AGC attack point of a tuner in accordance with the present invention.

DETAILED DESCRIPTION OF THE INVENTION

Figure 1:
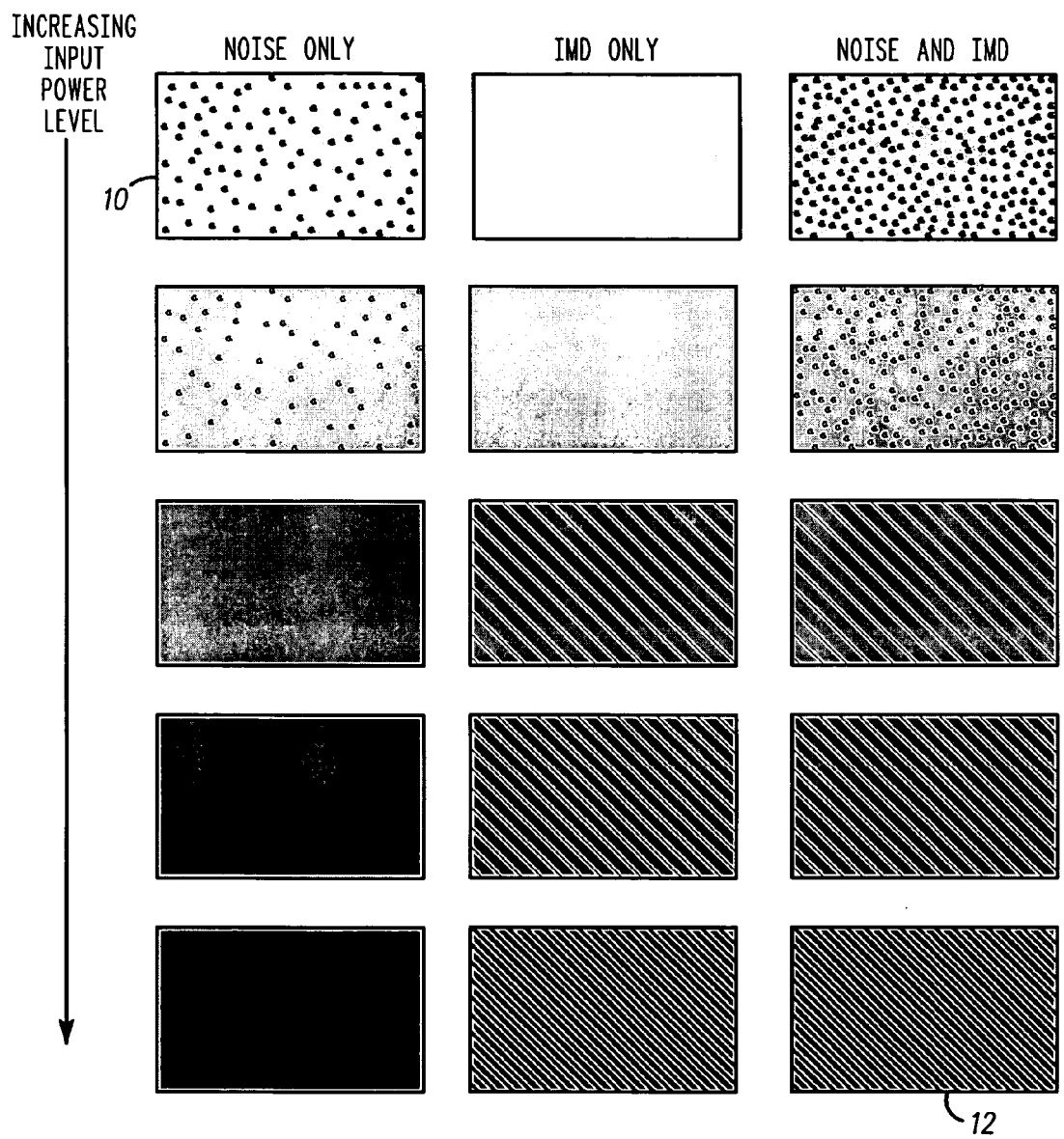
FIG. 1 illustrates the effects of noise and IMD on a video picture with increasing input power.

Persons of ordinary skill in the art will realize that the following description of the present disclosure is illustrative only and not in any way limiting. Other embodiments of the invention will readily suggest themselves to such skilled persons having the benefit of this disclosure.

The present invention uses demodulated video as an indicator to dynamically adjust the AGC attack point in a tuner for radio frequency (RF) modulated video signals. The output of a video decoder, e.g., in digital Y/Cb/Cr form, is accessible to a host processor which can retrieve individual video lines or even entire frames of video. The host processor utilizes the video to determine whether to raise, lower, or maintain the current value of the AGC attack point.

FIG. 4 illustrates one embodiment of the invention. An RF input signal 22 carries a plurality of video services, such as different television channels. When a user tunes the tuner 14 to a desired channel, the tuner recovers the RF modulated video signal associated with that channel as well known in the art. The recovered signal is demodulated to baseband in a video demodulator 30, and provided to a video decoder 26 which may include conventional analog to digital (A/D) conversion and separation functions. The resulting digitized video signal is processed by the settop (e.g., to provide on-screen display graphics) and then provided to a user's television set or other video appliance (not shown) in digital format. Alternatively, the digitized video signal can be converted to an analog signal and then provided to the user's television or other video appliance.

As shown in FIG. 4, and in accordance with the present invention, the digitized video 24 is also provided to a system unified memory 32. A host processor 34 can retrieve the digitized video from the memory 32. In accordance with the invention, the host processor executes an algorithm to dynamically set an AGC attack point for the tuner 14. The AGC attack point 36 set by the processor enables the tuner to recover the chosen RF modulated video signal with reduced noise and IMD. At the same time, the signal-to-noise ratio of the recovered RF modulated video signal is improved, since the noise is reduced.

In the embodiment of FIG. 4, the dynamic attack set point 36 is input to the video demodulator 30 instead of providing a fixed set point to the demodulator as shown in the prior art implementation of FIG. 3. The video demodulator 30 uses the dynamic attack set point 36 to provide an AGC control signal to tuner 14, as illustrated.

In the embodiment of FIG. 5, an AGC control signal is computed dynamically by the host processor 34 based on an internally calculated attack set point or any other suitable technique. The resultant dynamic AGC control signal 38 is provided to the tuner 14 without the need for any processing by the video demodulator 30.

There are various techniques that the host processor 34 can use to determine the attack set point or the dynamic AGC control signal. Preferred implementations are described herein, although those skilled in the art will appreciate that other techniques may be substituted for those shown. All such techniques are to be considered within the scope of the present invention.

In one implementation, the processor captures a quiet line, during the Vertical Blanking Interval (VBI) of the video signal, and calculates the video SNR. The processor 34 then analyzes the quiet line data for IMD. One method for determining IMD is to perform a Fast Fourier Transform (FFT). IMD will show up as an increased frequency component level in predetermined FFT bins. Line to line averaging, over multiple fields, can be utilized for both measurements.

The processor 34 can determine whether and how to adjust the attack point based on the SNR and IMD calculations. In a preferred embodiment, the processor will account for the fact that the input signal contains both noise and IMD, and will not adjust the attack point based on impairments present in the RF input signal 22. The preferred implementations will only adjust the AGC attack point based on the noise and IMD induced in the tuner 14.

The processor can also be designed to set limits on the high and low extremes of the attack point adjustments. Additionally, information derived from the video decoder can be used to adjust the attack point. IMD occurring very close to the picture carrier (within tens of kilohertz) will not be observable in an FFT. The clamp circuit and/or the DC restore section of the video decoder can overcome this limitation of an FFT implementation by providing information to the host processor indicating IMD levels.

Various techniques can be used to determine SNR and/or IMD for practicing the present invention. For the SNR determination, noise can be calculated in the time domain, or in the frequency domain (e.g., FFT with no correction for IMD or corrected for IMD), or in the time domain with correction for IMD (the preferred method). IMD measurement can be provided, e.g., in the frequency domain.

To calculate noise in the time domain without correction for IMD, a quiet line is captured, providing a series of digital video samples. The quiet line video samples are most likely not centered around zero amplitude. The average of the samples is calculated and subtracted from each sample. The resulting samples comprise just the noise. The noise (or SNR) is measured as:

Noise Power per line:

$$NP = \frac{1}{\text{points}} \cdot \sum_{i=0}^{points-1} (data_i)^2$$

Noise Power average:

$$NP_{avg} = \frac{1}{\text{lines}} \cdot \sum_{i=0}^{lines-1} NP_i$$

SNR (db):

$$SNR = 10 \cdot \log\left[\frac{(100IRE)^2}{NP_{avg}}\right]$$

The term 100IRE in the last equation represents the digital value corresponding to peak active video level, not related to a quiet line. This 100IRE reference constant is standard in video SNR measurements.

The noise power and SNR reading for a single line has some line to line variance due to the random nature of noise, and needs to be averaged. The averaging is done on the noise powers, then converted to db for mathematical correctness.

A drawback to the technique described immediately above is that it cannot distinguish between IMD and noise. It actually measures Signal to Noise+IMD ratio. If the IMD level is significant compared to the noise, the SNR calculation result is lower (indicating higher noise) than actual. Thus, this technique is not preferred.

Another embodiment calculates noise in the frequency domain using a fast Fourier transform (FFT). One implementation of such an embodiment is to capture a quiet line. The average of the samples is calculated, and subtracted from each sample. Alternatively, the subtraction step can be omitted, and replaced by zeroing the FFT bins at zero frequency. A Discrete Fourier Transform operation (preferably a FFT for computational efficiency) is then performed on the time domain samples. This provides a representation of the noise in the frequency domain, i.e. how much noise is contained in each frequency bin. Each point represents a particular frequency bin.

The total noise power is obtained by squaring the magnitude (FFT coefficients contain both real and imaginary components) of each bin value, summing the squares, and dividing by the number of bins. This division is not related to averaging, but is a mathematical factor resulting from the FFT process equations. This calculation, based on the FFT, will yield the same result as the time domain calculation. The following equation is an example showing the zeroing of bin 0 (not including in the summation). S represents the FFT bin complex values.

Noise Power:

$$\frac{1}{\text{bins}-1} \cdot \left[\sum_{j=1}^{bins-1} (|s_j|)^2\right]$$

As in the time domain calculation, it is beneficial to average the noise powers over multiple lines, before making the SNR calculation. The averaging provides an SNR value stabilization and accuracy improvement. This technique, without modification, has the same drawback as with the previous technique described, in that it includes IMD power in the result.

Another technique, as mentioned above, is to calculate noise in the frequency domain (FFT), corrected for IMD. This technique is identical to the previous technique, except for omitting specific bins in the power summation. The omitted bins are those where IMD would be expected to appear. The divider for the number of bins in the equation is correspondingly decreased by the number of omitted bins. The decrease in the divisor essentially replaces the IMD bin value with an estimate of the noise in the bin, based on the noise-only bins.

As previously indicated, the preferred implementation is to calculate noise in the time domain, with correction for IMD. This technique is initiated by obtaining the average noise power as described above. As indicated, this result will contain both noise and IMD. IMD included in the noise measurement is then eliminated. In particular, by independently determining the IMD, it is possible to then subtract the IMD power from the noise+IMD power initially obtained. One method for measuring IMD power, namely IMD calculation in the frequency domain, will now be described.

The technique is to average the FFT power spectrum over multiple quiet lines. Then the power in the IMD bin is obtained from the averaged power spectrum. The averaging of the noise spectrums minimizes the noise component in the IMD frequency bin. In a particular bin which contains IMD, both the noise and IMD components contributing to the FFT bin value are complex values. Therefore, the random noise can add or subtract to the bin value's magnitude and therefore its power. By averaging the IMD bins power over multiple lines, the noise component of the bin is minimized, thereby resulting in a more accurate determination of the IMD only component.

Note that in instead of obtaining and averaging the entire power spectrum for each line (for each frequency bin), it is only necessary to calculate the specific IMD potential bins, since these are the only bins utilized in the calculation for the IMD. The calculation can be made as follows:

IMD Power:

$$\text{IMDavg\_power} = \frac{1}{\text{lines}} \cdot \frac{1}{\text{bins}} \cdot \sum_{line=0}^{lines-1} [|(s_{line})_{IMDbin}|]^2$$

It is noted that due to the properties of an FFT (and Discrete Fourier Transform—DFT), the IMD may appear in several adjacent bins (spectral leakage), rather than falling entirely into one bin. Thus, it may be advantageous to extend the described method to power sum and average more than one bin.

Computational efficiencies can be employed to reduce the complexity and number of host processor calculations in the measurements. For instance, the results can be left in power units and the comparisons made in these units, rather than converting to a db value. Further, the divisor(s) in calculating noise and IMD power can be omitted, and the comparisons done accordingly. For the noise calculation, the entire FFT across all bins need not be performed. A reduced frequency interval can be used and the comparisons adjusted accordingly. This takes advantage of the likelihood that the noise level will be consistent over frequency.

Moreover, the IMD power average only needs to be performed on the IMD bin. This simplifies the FFT, as only the IMD bin frequencies need to be transformed. The number of mathematical computations can also be substantially reduced by using an FFT in place of a DFT for frequency transforms.

Figure 6:
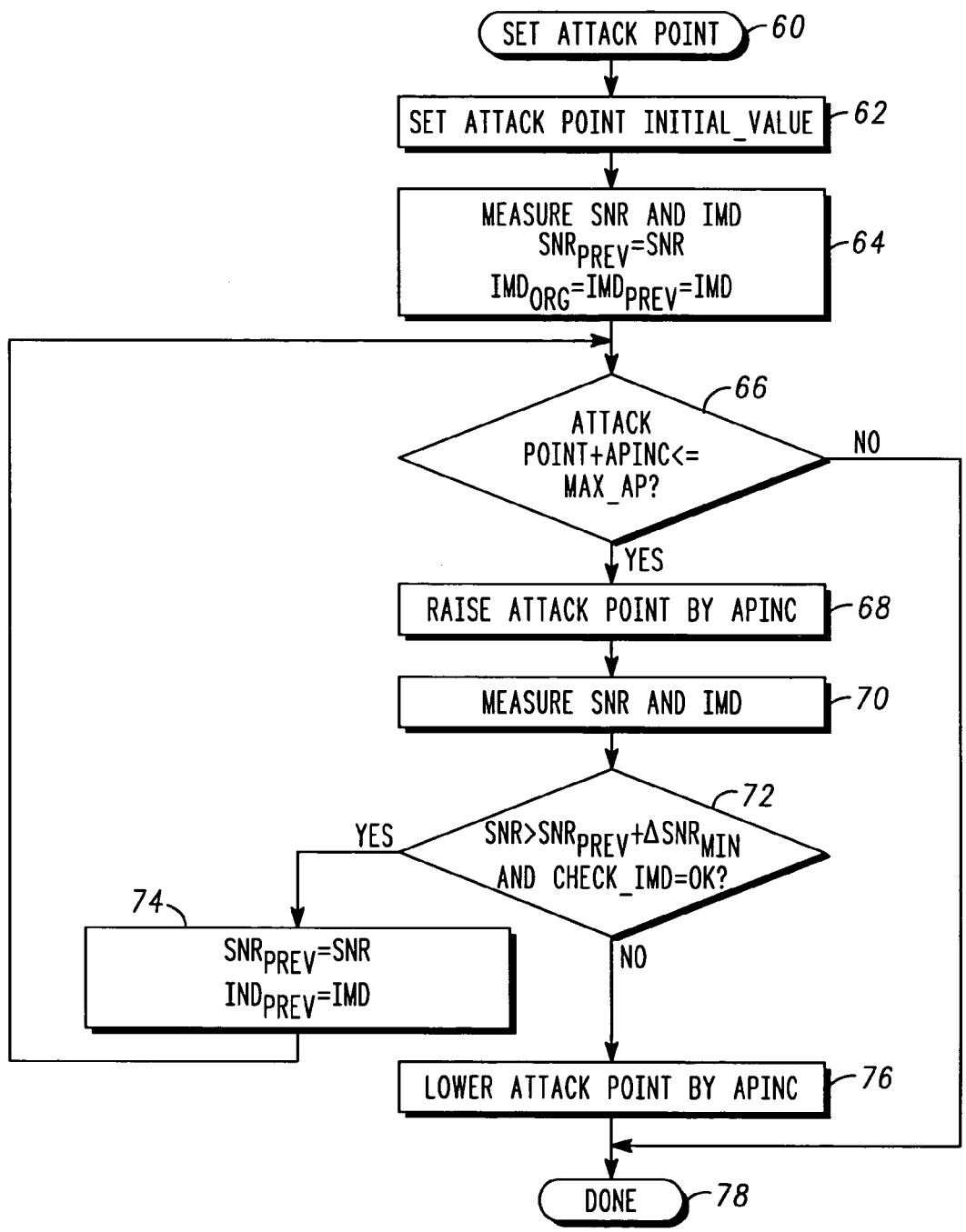
FIG. 6 is a flowchart of an example routine for setting the AGC attack point in accordance with the present invention.

FIG. 6 illustrates a routine for setting the AGC attack point for a tuner, in accordance with the invention. In this algorithm for adjusting the attack point, the attack point is continually increased provided a significant improvement in signal to noise is realized and IMD is still acceptable.

The routine starts at box 60. At box 62, the attack point is set to an initial value. This initial value (0 dbmV as an example) is expected to yield minimal intermodulation distortion (IMD) caused by the settop. There may be significant IMD (and noise) on the RF signal coming into the settop.

At box 64, the SNR and IMD at the initial attack point setting are measured and stored. Both the measured SNR and IMD are a combination of (i) the SNR (noise) and IMD of the input signal, and (ii) that caused by the RF front end of the settop (i.e., the tuner). As indicated, $SNR_{previous}$=SNR and $IMD_{original}$=$IMD_{previous}$=IMD.

At box 66, a determination is made as to whether the present attack point setting plus the increment (not yet applied) will still be below the maximum allowed attack point. If so, the routine proceeds on to box 68. Otherwise the routine is ended at box 78. APinc represents the attack point setting increment value.

At box 68, the attack point is raised by the APinc increment. Then, SNR and/or IMD are measured as indicated at box 70. Then, at box 72, a determination is made as to whether the SNR has been improved and the IMD is below the maximum acceptable value. If so, at box 74 the current SNR value is stored as a reference for the next time through the loop, and the routine loops back to box 66. Otherwise, the attack point is lowered by the APinc increment at box 76, thereby returning to the previous attack point. The routine then ends at box 78.

By raising the attack point of the tuner, two results can occur. First, if the input signal strength is equal to or below the preceding attack point setting, no change in SNR or IMD will result. The tuner's front end does not begin to attenuate the input signal until the signal strength is greater than the attack point. In this case, increasing the attack point changes nothing. Second, if the input signal is greater than the preceding attack point setting, increasing the attack point decreases the tuner's front end attenuation and allows more signal through the tuner. More signal through the tuner yields a higher SNR when compared to the tuner's inherent noise output.

Unfortunately, noise on the input signal can affect the SNR measurement. In order to deal with this fact, the process for measuring SNR can assume that there is no noise on the input signal, or more realistically, an insignificant amount of noise as compared to the noise floor of the tuner.

If the input signal level is above the attack point, and the attack point is raised by 1 db, the amount of signal out of the tuner rises by 1 db. With no noise on the input signal, the amount of noise out of the tuner remains the same (the noise which is internally generated by the tuner remains constant with respect to the amount of the tuner RF attenuation). Therefore the SNR out of the tuner rises by 1 db when the attack point is raised by the same amount.

Now assume there is a significant amount of input noise. Raising the attack point by 1 db will again cause the amount of signal out of the tuner to rise by 1 db (assuming the input signal level is above the previous attack point level). However, the amount of tuner output noise caused by input noise also rises by 1 db. Still, the amount of tuner internally generated noise remains constant. The resulting SNR increase is a function of how much noise is on the input signal.

By increasing the attack point by 1 db:
1. If the signal level is equal to, or less than the previous attack point, there will be no change in output SNR.
2. If the signal level is greater than the previous attack point:
    2.1 If there is no (or very little) noise on the input signal, the SNR will increase by about 1 db (assuming that the input level is still at or greater than the new attack point which was increased by 1 db).
    2.2 If there is significant noise on the input signal, the SNR will increase by a value between about 0 and 1 db, depending on the amount of input noise. The following table describes the increase in SNR versus the amount of input noise, assuming an 10 db front end noise figure:

TABLE

| Case | Input Level | Input CNR | SNR AP = 0 dbmV | SNR AP = 1 dbmV | SNR change |
|---|---|---|---|---|---|
| 1. | 0 dbmV | db | 49.00 db | 49.00 db | 0 db |
| 1. | 0 dbmV | 60 db | 48.67 db | 48.67 db | 0 db |
| 1. | 0 dbmV | 43 db | 42.03 db | 42.03 db | 0 db |
| 1. | −3 dbmV | 43 db | 41.24 db | 41.24 db | 0 db |
| 2.1 | 3 dbmV | db | 49.00 db | 50.00 db | 1.00 db |
| 2.1 | 3 dbmV | 65 db | 48.89 db | 49.86 db | 0.97 db |
| 2.1 | 1 dbmV | db | 49.00 db | 50.00 db | 1.00 db |
| 2.1 | 1 dbmV | 65 db | 48.89 db | 49.86 db | 0.97 db |
| 2.2 | 3 dbmV | 60 db | 48.67 db | 49.59 db | 0.92 db |
| 2.2 | 3 dbmV | 55 db | 48.03 db | 48.81 db | 0.78 db |
| 2.2 | 3 dbmV | 50 db | 46.46 db | 46.99 db | 0.53 db |
| 2.2 | 3 dbmV | 45 db | 43.54 db | 43.81 db | 0.26 db |

At box 74, the present SNR and IMD values are stored as a reference for the next time through the loop. In particular, the previous value of SNR ($SNR_{previous}$) is reset to the present SNR value, and the previous IMD value ($IMD_{previous}$) is reset to the present IMD value. At box 76, the last attack point increment, is deducted, because it did not improve SNR substantially or increase the IMD too much.

Figure 7:
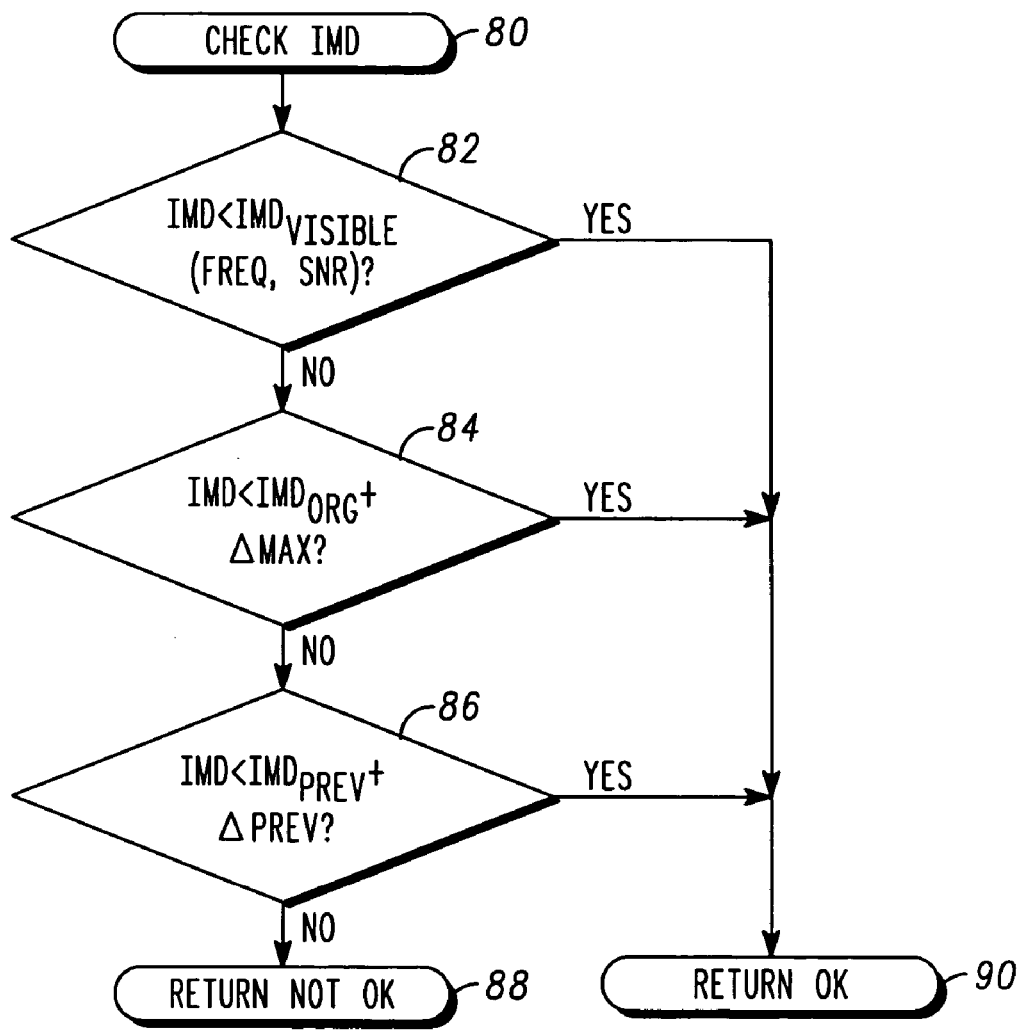
FIG. 7 is a flowchart of an example routine for establishing the maximum IMD to be used when setting the AGC attack point in accordance with the present invention.

FIG. 7 illustrates an example routine for checking the IMD to make sure it does not exceed maximum acceptable values. The routine starts at box 80. If, at box 82, the measured IMD is found to be less than the predicted visible level (based on current SNR and the IMD frequency position in the video band), an "OK" designation is returned to accept the new attack point based on the IMD level. If the measured IMD is not less than the predicted visible level (the "No" path from box 82), there are still two cases where the new attack point is accepted. These two cases are shown at boxes 84 and 86, respectively.

In particular, as shown at box 84, even though the IMD is considered visible (as determined at box 82), a majority of the IMD may be due to IMD on the input signal, and not induced by the tuner. In this case, it still could be advantageous to accept the new attack point if the improvement in SNR subjectively outweighs the IMD visibility. However, a limit needs to be placed on the increase in IMD (MAX) over the original input IMD. It is noted that the input IMD is considered to be equal to the first IMD measurement made at the initial_value attack point, and is termed IMDorg. If the SNR is continuously improved (through attack point increases), yet the IMD level increases and is above the point of visibility, the IMD will be become more and more visible. The test set forth in box 84 is an effort to balance the visual improvement of reduced noise versus the unfortunate reality of IMD becoming more visible with a less noisy picture. It prevents IMD from growing too big versus the original measured input IMD (IMDorg).

Care must be taken when adopting the approach illustrated in box 84. For example, if the input signal is at a high level with high SNR, but contains a high IMD level, SNR will be improved with an attack point rise. Yet box 84 allows the IMD to remain constant at the input IMD level, or even grow a little bit. The picture will get less noisy, and even if the IMD hasn't grown, the IMD will become more visible due to the less-noisy picture. However, it is subjective to a particular viewer whether the improvement in noise outweighs the increased visibility of IMD. Those skilled in the art will appreciate that fine tuning of this step can be accomplished empirically. For example, data can be taken both before the attack point rise when the picture will be a little noisy, with visible IMD, and after the attack point rise when the picture is cleaner, but IMD is slightly more visible (subjective), even though the IMD measured level is about the same.

Box 86 indicates another "accept" path similar to that in box 82, but allows additional growth in IMD based on the previous attack point's IMD level. It allows slow creep of IMD past the level allowed in step 84. As with boxes 82 and 84, if the conditions of box 86 are not met, the routine will pass to box 88 where a "not OK" indication is returned. On the other hand, if the conditions are met, an "OK" indication will be returned as shown at box 90. It should be appreciated that refinements of the tests set forth in boxes 82-86 are possible, as are additional tests for checking IMD.

While embodiments and applications of this disclosure have been shown and described, it would be apparent to those skilled in the art that many more modifications than mentioned above are possible without departing from the inventive concepts herein. The disclosure, therefore, is not to be restricted except in the spirit of the appended claims.

What is claimed is:

1. A method for controlling a tuner for radio frequency (RF) modulated video signals, comprising:
   recovering an RF modulated video signal in said tuner;
   demodulating the recovered signal to obtain a baseband video signal;
   obtaining signal-to-noise ratio (SNR) and intermodulation distortion (IMD) for said baseband video signal;
   determining whether the SNR has been improved;
   determining if the IMD is below a maximum acceptable value; and
   controlling an AGC attack point of said tuner in response to the determining whether the SNR has been improved and the determining if the IMD is below a maximum acceptable value.

2. A method in accordance with claim 1 wherein:
   said baseband video signal provides digitized video; and
   said at least one of SNR and IMD are obtained from said digitized video.

3. A method in accordance with claim 2, comprising:
   capturing a quiet video line of said digital video and determining the video SNR during said quiet line.

4. A method in accordance with claim 3 wherein said quiet video line is captured during a vertical blanking interval of said baseband video signal.

5. A method in accordance with claim 4 comprising:
   analyzing said quiet video line to obtain IMD.

6. A method in accordance with claim 5 wherein said analyzing step uses a Fast Fourier Transform (FFT) to obtain IMD.

7. A method in accordance with claim 6 wherein line-to-line averaging over multiple video fields is used to obtain at least one of the SNR and IMD.

8. A method in accordance with claim 2, comprising:
   capturing and analyzing a quiet video line of said digital video to obtain IMD.

9. A method in accordance with claim 1 wherein:
   said RF modulated video signal is recovered from an input signal received by said tuner; and
   said AGC attack point is controlled substantially exclusive of noise and IMD present in said input signal.

10. A method in accordance with claim 1, comprising setting limits on high and low extremes of attack point adjustments made during said controlling.

11. A method in accordance with claim 1, wherein:
    said baseband video signal comprises digitized video decoded during a video decoding step; and
    a video decoder used for said video decoding provides IMD levels for controlling said AGC attack point.

12. Apparatus for managing noise and distortion levels in video recovered from an RF modulated signal, comprising:
    a tuner for recovering an RF modulated video signal;
    a video demodulator for providing a baseband video signal from the recovered RF modulated video signal; and
    a processor for obtaining and determining if a signal-to-noise ratio (SNR) has been improved and for obtaining and determining if intermodulation distortion (IMD) is below a maximum acceptable value for said baseband video signal;
    wherein said processor controls an AGC attack point of said tuner in response to determining whether the SNR has been improved and the determining if the IMD is below a maximum acceptable value.

13. Apparatus in accordance with claim 12 wherein:
    said baseband video signal provides digitized video; and
    said processor obtains said at least one of SNR and IMD from said digitized video.

14. Apparatus in accordance with claim 13, wherein said processor captures a quiet video line of said digital video and determines the video SNR during said quiet line.

15. Apparatus in accordance with claim 14, wherein said quiet video line is captured during a vertical blanking interval of said baseband video signal.

16. Apparatus in accordance with claim 15, wherein said processor analyzes said quiet video line to obtain IMD.

17. Apparatus in accordance with claim 16, wherein said processor uses a Fast Fourier Transform (FFT) to obtain IMD.

18. Apparatus in accordance with claim 17, wherein line-to-line averaging over multiple video fields is used to obtain at least one of the SNR and IMD.

19. Apparatus in accordance with claim 13, wherein said processor captures and analyzes a quiet video line of said digital video to obtain IMD.

20. Apparatus in accordance with claim 12, wherein:
said RF modulated video signal is recovered from an input signal received by said tuner; and
said AGC attack point is controlled substantially exclusive of noise and IMD present in said input signal.

21. Apparatus in accordance with claim 12, wherein said processor sets limits on high and low extremes of attack point adjustments made.

22. Apparatus in accordance with claim 12 further comprising:
a video decoder for providing said baseband video signal as digitized video;
said video decoder cooperating with said processor to provide IMD levels for controlling said AGC attack point.

* * * * *